United States Patent [19]
Law

[11] Patent Number: 5,259,920
[45] Date of Patent: Nov. 9, 1993

[54] MANUFACTURING METHOD, INCLUDING ETCH-RATE MONITORING

[75] Inventor: Henry H. Law, Berkeley Heights, N.J.

[73] Assignee: AT&T Bell Laboratories, Murray Hill, N.J.

[21] Appl. No.: 816,416

[22] Filed: Dec. 31, 1991

[51] Int. Cl.⁵ .............................. B05D 5/00
[52] U.S. Cl. .................... 156/626; 156/655; 156/656; 156/666
[58] Field of Search ............... 156/626, 664, 666, 655, 156/656; 204/192.33

[56] References Cited

U.S. PATENT DOCUMENTS

| | | |
|---|---|---|
| 2,149,344 | 3/1939 | Hull . |
| 4,367,044 | 1/1983 | Booth, Jr. et al. ............ 156/626 X |
| 4,436,579 | 3/1984 | Rose et al. ............ 156/626 |
| 4,512,847 | 4/1985 | Brunsch et al. ............ 156/626 |
| 4,650,744 | 3/1987 | Amano ............ 156/626 X |
| 4,708,765 | 11/1987 | Newman et al. ............ 156/626 |
| 4,717,446 | 1/1988 | Nagy et al. ............ 156/626 |
| 4,767,660 | 8/1988 | Hosoda et al. ............ 156/626 X |
| 4,863,548 | 9/1989 | Lee ............ 156/626 X |
| 4,935,108 | 7/1990 | Rohlev ............ 204/15 |

OTHER PUBLICATIONS

Gust, W. et al., "Techniques for the Production of Oriented Bicrystals and Results on Specimens Prepared by These Methods," Acta Metallurgica, vol. 28, Pergamon Press Ltd., 1980, pp. 1235-1243.

*Primary Examiner*—Thi Dang
*Attorney, Agent, or Firm*—M. I. Finston; E. E. Pacher

[57] ABSTRACT

A method is described for monitoring the rate at which metal layers are chemically etched. The method involves an indicator layer of metal formed on a surface of a monitor substrate. The thickness of the indicator layer varies according to a wedge-shaped profile along a longitudinal axis. The indicator layer is exposed to an etchant medium for a predetermined duration. During such exposure, a portion of the indicator layer is completely removed, exposing the underlying surface and creating an edge between the exposed surface and the remaining portion of the indicator layer. The etching rate is determined by reference to the longitudinal location of the edge.

8 Claims, 3 Drawing Sheets

COPPER THICKNESS SCALE (μm)

MANUFACTURING METHOD, INCLUDING ETCH-RATE MONITORING

FIELD OF THE INVENTION

The invention relates to the field of etching metal layers by exposing them to etchant solutions, and more particularly, to the monitoring of such etching processes in order to determine the net etching rate.

ART BACKGROUND

Conventional manufacturing sequences for making hybrid circuits or printed circuit boards generally include a step of etching a layer of copper (or an equivalently useful metal) in order to produce a patterned, electrically conductive layer. In order to assure that the results of such a process are both acceptable and reproducible, the practitioner must continually or periodically determine, inter alia, the etch rate, and must make adjustments to processing conditions when the etch rate is observed to deviate from a predetermined, acceptable range. The procedure for controlling a given etching process is generally specific to the chemistry of that process. However, a widespread method for monitoring the etching rate is to provide a copper layer with a known, uniform, initial thickness, subject the layer to the etchant, and periodically measure the thickness of the layer as the etching process progresses. Although this method has the advantages that it is independent of etchant chemistry and responsive to the mass-transfer conditions of the etching process, it also has certain disadvantages. That is, it requires many thickness measurements in order to provide an acceptable degree of accuracy. Because each measurement involves the use of specialized inspection equipment, a relatively large amount of time is consumed by the measurements. This may lead to bottlenecks, and, by increasing processing time, may also lead to increased production costs.

SUMMARY OF THE INVENTION

We have developed a manufacturing method which includes an etching step. The etching rate is monitored by novel apparatus which is easy to use and self-contained, and can be read in a time which is comparable to, or shorter than, typical response times of commercial etching systems. The monitor apparatus is responsive to the mass-transfer conditions of the etching process.

In a broad sense, our invention involves a substrate, which is typically selected to physically resemble the substrates of the workpieces that are to be etched (although such resemblance is not absolutely necessary). A layer of the metal that is to be etched is deposited, exemplarily by electroplating, on at least one principal surface of the substrate. Such a layer is hereafter referred to as an "indicator layer." Significantly, the thickness of the indicator layer is not uniform, but instead has a substantially wedge-shaped profile, such that the thickness increases in a lateral direction, to be referred to as the "longitudinal" direction. (By "lateral directions" are meant directions parallel to the surface of the substrate.)

The monitor substrate is subjected to the same etching process as the workpieces. The cumulative amount of metal that has been removed at any given time from the workpieces and from the monitor substrate is directly indicated by the location of the edge of the indicator layer. That is, that portion of the indicator layer which has a metal thickness less than the cumulative etched thickness will be substantially removed, exposing the underlying substrate surface, or exposing an underlying layer of metal which is relatively resistant to the etching process. As a result, the edge which delimits that portion of the indicator layer that has been removed is readily observable by visual inspection, or by mechanized inspection using, e.g., a reflectometer. An operator can readily compare the location of the edge with a previously prepared scale which relates edge position to cumulative amount of metal removed (or even, by reference to a predetermined etching duration, to the net etch rate).

DETAILED DESCRIPTION

A currently preferred embodiment of the invention will now be described. As will be discussed below, the inventive monitor was used in connection with an ammoniacal copper chloride etchant for etching copper. However, the inventive monitor will be equally applicable to any system for the chemical etching of metal films where the underlying substrate (or relatively etch-resistant layer) offers visual contrast with the etched metal layer.

Figure 1:
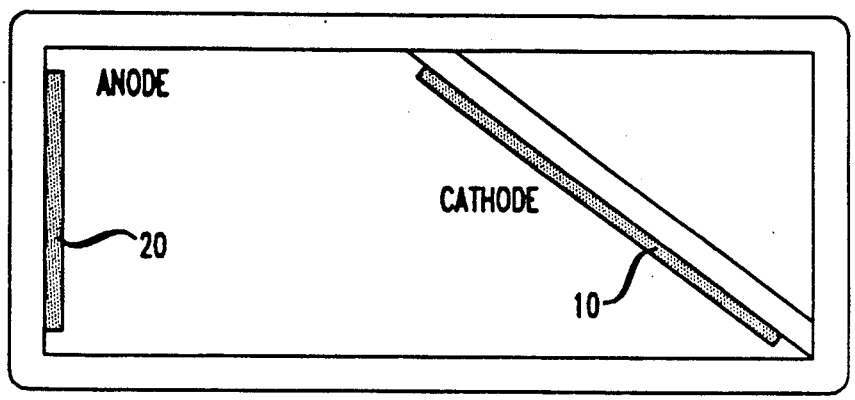
FIG. 1 is a schematic, top view of an electroplating cell, of the kind commonly referred to as a "Hull cell," useful for depositing an indicator layer according to the invention.

An exemplary etching rate monitor was made by sputter-depositing a sequence of thin, conductive metal layers on a standard ceramic substrate of lateral dimensions 3.75 in. ×4.5 in. The uppermost layer was copper, and underlying the copper was a pair of layers chosen to provide good adhesion to the ceramic substrate. The substrate was then incorporated as the cathode panel 10 of the Hull cell of FIG. 1, and electroplated with copper according to methods well known in the art. As a consequence of the non-parallel arrangement of cathode 10 and anode 20 of the Hull cell, the electrodeposition resulted in a wedge-shaped copper thickness profile which varied in the length dimension. (It should be noted that Hull cells are well known in the electroplating arts and are extensively used to evaluate electroplating baths. See, e.g., U.S. Pat. No. 2,149,344, issued to R. O. Hull on Mar. 7, 1939.)

Figure 2:
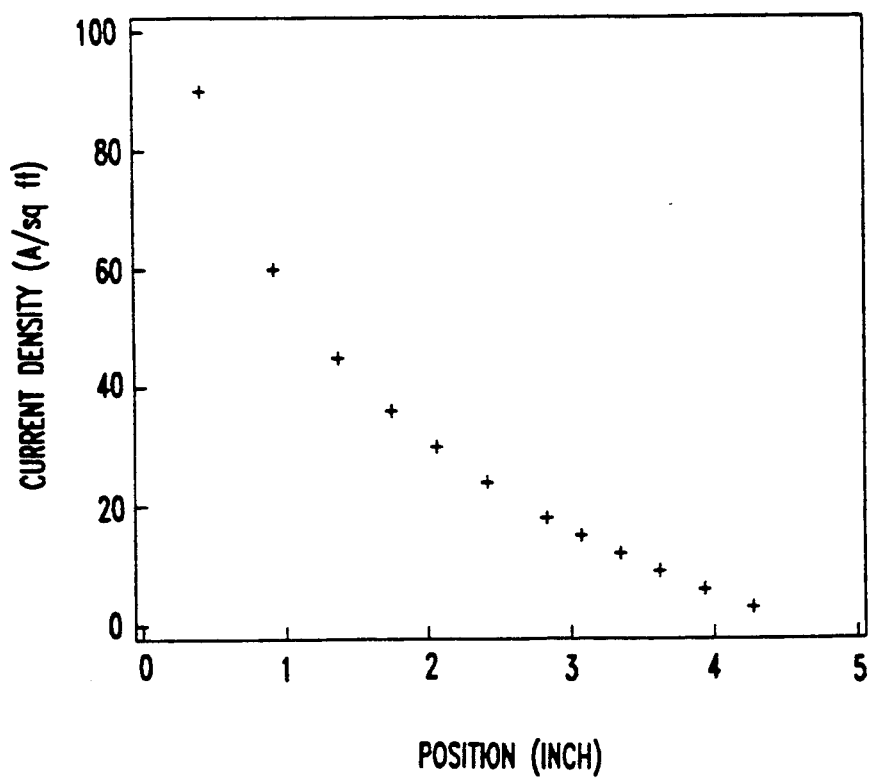
FIG. 2 is a plot of the expected electric current distribution on a typical cathode panel of the Hull cell of FIG. 1.

Shown in FIG. 2 is the expected current distribution on the cathode for an illustrative one-liter Hull cell passing 3 amperes on a 5-inch cathode panel. Because the ceramic substrate was only 4.5 inches long, it was readily processed in such a standard one-liter Hull cell without any modification. For trial purposes, a median thickness of 10 μm was selected for the electrodeposited copper layer. The plating time was 15 minutes. It will be convenient to hereafter refer to the principal monitor surface facing the anode as the front surface, the edge oriented upward in the Hull cell as the top edge, and the edge oriented downward as the bottom edge. Horizontal position along the monitor front surface, as oriented in the Hull cell, is referred to herein as "longitudinal position." Thus, the principal direction along which the deposited copper thickness varied was the longitudinal direction.

Figure 3:
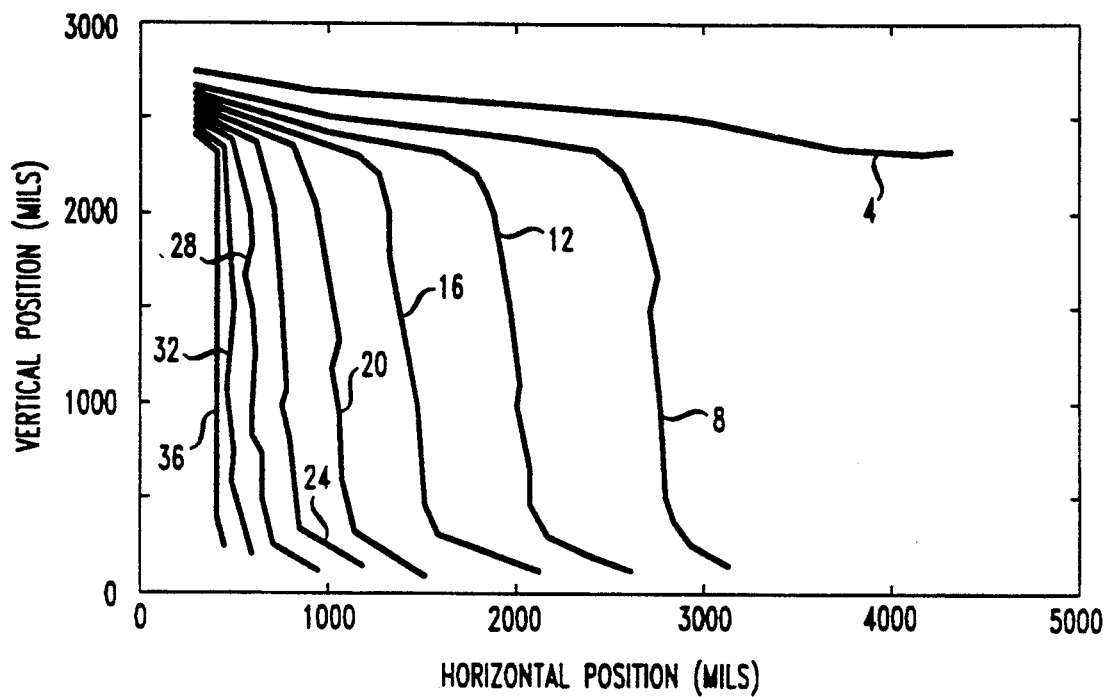
FIG. 3 is a surface contour map of the copper thickness, in micrometers, of a typical indicator layer made by depositing copper in the Hull cell of FIG. 1.

To determine the reproducibility of the thickness profiles, 135 rate monitors were made and six of them were randomly selected for systematic thickness measurements using an x-ray fluorescence analyzer (UPA model 300). For each of the selected monitors, a central rectangular area was marked off and measured at the vertices of a grid pattern having a 4 mm×4 mm spacing. The thickness measurements, shown in FIG. 3, were plotted as contour maps and analyzed statistically. In particular, it was observed that near the center of the substrate, the thickness exhibited a linear variation with longitudinal position.

Figure 4:
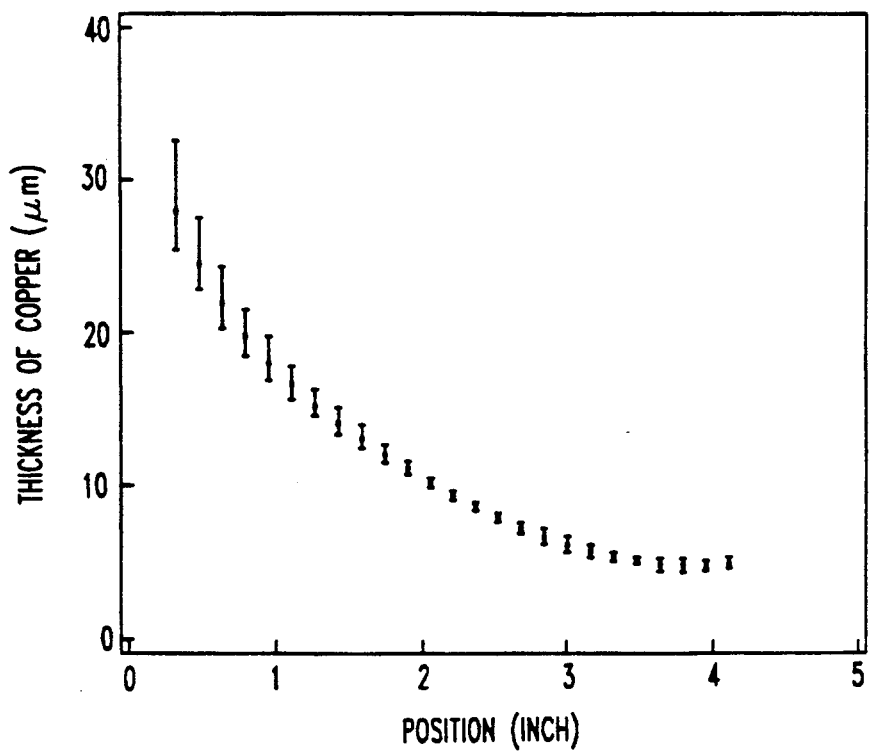
FIG. 4 is a graph of copper thickness versus position, for a batch of copper indicator layers made in the Hull cell of FIG. 1. At each selected position, the maximum, average, and minimum thicknesses over the sample set are shown.

The thickness measurements taken along a line 1.5 inch (3.8 cm) from the bottom edge of each monitor were grouped together in a sample set and the maximum, mean, and minimum over the set at each longitudinal position were plotted as shown in FIG. 4. It is apparent from the figure that the measurements near the center position exhibited the smallest variation. Table 1 shows the standard deviation of the measurements as a function of longitudinal position.

Figure 5:
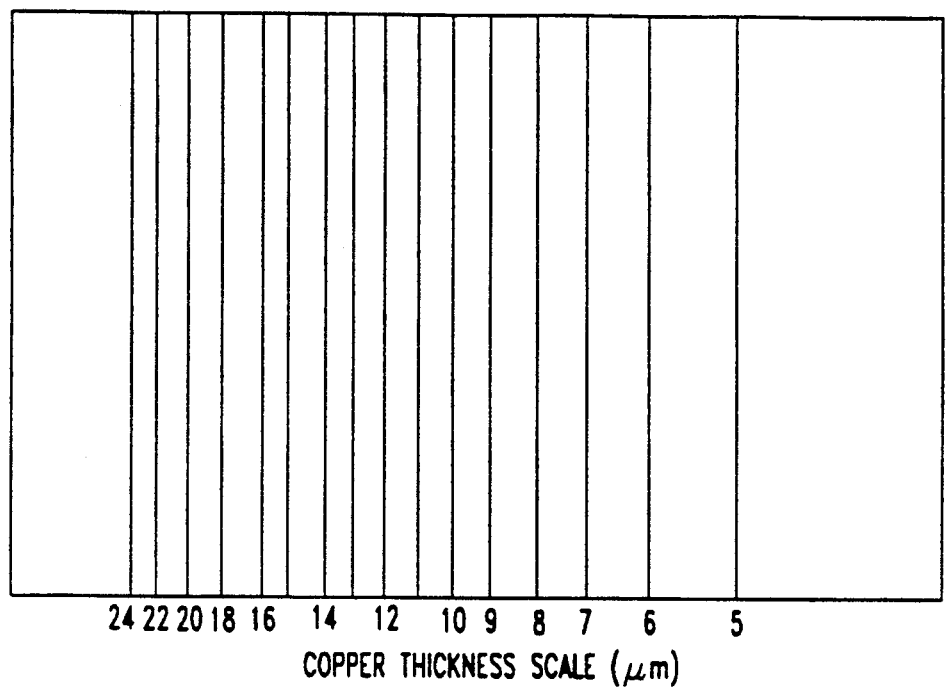
FIG. 5 is an illustrative copper thickness scale, in micrometers, which can be used to relate the edge of the etched indicator layer to the cumulative thickness of copper that has been removed.

It is apparent that over a central 80% portion of the monitor, the standard deviation of the measured thicknesses was less than 7%, and the difference between the maximum and minimum measurements (expressed as a percentage of the average thickness) was less than 20%. For process monitoring purposes, the etch rate typically needs to be known with an accuracy of about 10%. Thus the process for making etching rate monitors described here will result in useful monitors, even without further refinements in their manufacture. Using the known mean thicknesses, the practitioner can readily construct a scale to facilitate the reading of the cumulative amount of metal which has been etched. Depicted in FIG. 5 is such a scale, which has been constructed from the data of FIG. 4. It is convenient, for example, to prepare such a scale on a sheet of transparent, polymeric material which can be superimposed, as an overlay, on the etched monitor. The position of the etched-back edge of the indicator layer is then visible through the overlay, and can be located relative to the scale. The corresponding cumulative etched thickness can be read directly from the scale at the location of the edge.

An alternative scale comprises a pattern, such as a grid pattern, of relatively etch-resistant metal formed on the substrate surface and underlying the indicator layer. As the indicator layer is etched back, portions of such a pattern are progressively exposed. Such a pattern is preferably made from a metal which offers visual contrast relative to both overlying and underlying material. An exemplary such pattern is made by evaporatively depositing gold through an appropriate mask, or by etching a pattern in a metal layer which underlies the indicator layer.

Figure 6:
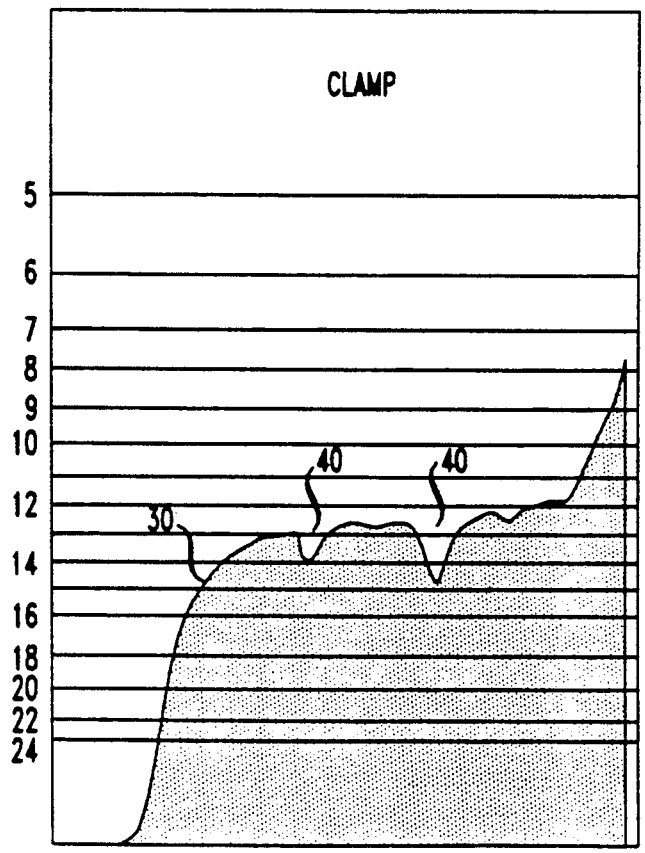
FIG. 6 is an outline of a typical etching rate monitor which has been etched, and upon which a scale, such as the scale of FIG. 5, has been superimposed.

One application of the inventive monitor is to evaluate modifications in the etching process. For example, the inventive monitor was used to evaluate the performance of etchant spray nozzles of different designs. FIG. 6 shows the appearance of the etched-back edge 30 of the indicator layer after a rate monitor was exposed to the etchant from one such nozzle. The monitor was suspended vertically from support clamps, and thus was oriented as shown in the figure. The notch-like indentations 40 in the edge were caused by subsequent dripping of etchant from the support clamps. As viewed in FIG. 6, the right-hand edge of the monitor corresponds to the bottom edge during electroplating, and the left-hand edge corresponds to the top edge. The indicator layer did not extend all the way to the left-hand edge of the monitor of FIG. 6 because, during electroplating, the plating bath did not reach all the way to that edge.

By way of comparison, numerous thickness measurements on etched samples would be required in order to conventionally obtain equivalent information from samples bearing copper layers of nominally uniform thickness. For example, a mapping with 1 mm×1 mm resolution covering the entire substrate would require 9,375 measurements.

One use of the inventive monitor is for process control on a manufacturing line for hybrid circuits or printed circuits. Such circuits include a substrate, exemplarily of ceramic material, and a patterned metal layer, exemplarily of copper. At a certain stage in the manufacturing process, substrates are provided, bearing a substantially uniform layer of, e.g., copper, which is overlain by a patterned resist. Substrates are subjected to an etchant bath or an etchant spray, for removing that portion of the metal which is not protected by the resist. This is generally achieved, in mass production, by placing substrates, or groups of substrates, at intervals along a conveyor belt. Each substrate or group is etched as it passes through an etching station.

Certain process parameters, subject to control by the operator, can influence the rate at which metal is removed. Such parameters may include the etchant temperature and the duration of the etching step. In order to assure that the process parameters remain at their desired settings, it is necessary to measure the etching rate at certain intervals. The inventive monitor is advantageously used for this purpose by including at least one monitor adjacent or in place of at least one substrate to be processed. Simple visual inspection of the monitor after etching will then inform the operator of the etching rate. Such inspection may be with the aid of a transparent overlay, as described. Alternatively, inspection may be with the aid of a scale previously marked on the monitor substrate. According to the result of such inspection, the operator will adjust the process parameters as required. Thus, the time required to measure the etching rate is not substantially greater than the time required to etch one of the inventive monitors. Monitors will typically be subjected to this processing at periodic intervals, exemplarily twice in each eight-hour shift.

TABLE 1

| Location (inch) | average thickness ($\mu$) | standard deviation ($\mu$) | max ($\mu$m) | min ($\mu$m) |
| --- | --- | --- | --- | --- |
| 4.11 | 4.66 | .23 | 5.00 | 4.37 |
| 3.95 | 4.55 | .19 | 4.89 | 4.37 |
| 3.79 | 4.65 | .18 | 4.94 | 4.48 |
| 3.64 | 4.77 | .19 | 5.12 | 4.58 |
| 3.48 | 5.02 | .16 | 5.28 | 4.79 |
| 3.32 | 5.36 | .23 | 5.59 | 4.99 |
| 3.16 | 5.76 | .38 | 6.34 | 5.22 |
| 3.00 | 6.16 | .39 | 6.81 | 5.71 |
| 2.85 | 6.70 | .36 | 7.33 | 6.36 |
| 2.69 | 7.35 | .29 | 7.88 | 7.10 |
| 2.53 | 8.04 | .25 | 8.50 | 7.83 |
| 2.37 | 8.74 | .21 | 9.04 | 8.54 |
| 2.22 | 9.51 | .32 | 9.95 | 9.22 |
| 2.06 | 10.43 | .35 | 10.92 | 10.03 |
| 1.90 | 11.37 | .42 | 11.96 | 10.87 |
| 1.74 | 12.30 | .47 | 12.99 | 11.69 |
| 1.58 | 13.40 | .52 | 14.12 | 12.75 |
| 1.43 | 14.46 | .55 | 15.39 | 13.78 |
| 1.27 | 15.55 | .68 | 16.44 | 14.73 |
| 1.11 | 16.98 | .82 | 18.36 | 16.07 |
| .95 | 18.47 | .89 | 19.58 | 17.23 |
| .79 | 20.32 | 1.30 | 22.20 | 18.64 |
| .64 | 22.50 | 1.31 | 24.28 | 21.00 |
| .48 | 25.11 | 2.83 | 28.79 | 21.55 |
| .32 | 28.67 | 2.66 | 32.24 | 25.83 |

I claim:

1. A method for manufacturing an article, comprising the steps of:
   a) providing at least one workpiece which comprises etchable material;
   b) providing a monitor body which comprises etchable material;
   c) exposing at least a portion of the monitor body to an etchant environment such that etchable material is removed from the monitor body at an etching rate that is subject to at least one controllable process parameter;
   d) determining the etching rate by observing the monitor body; and
   e) exposing at least a portion of the workpiece to the etchant environment such that etchable material is removed from the workpiece. Characterized in that
   f) the method further comprises, before or during (e), setting the process parameter such that the etching rate falls within predetermined limits;
   g) the monitor body further comprises a relatively etch-resistant substrate having a substantially planar principal surface, the principal surface includes a longitudinal axis, and the monitor-body etchable material comprises an indicator layer partially overlying the principal surface;
   h) the indicator layer has a lower surface adjacent the substrate, an upper surface distal the substrate, an apical edge where the upper and lower surfaces meet, and between the upper and lower surfaces, a thickness that increases with longitudinal distance from the apical edge;
   i) at any given time, the apical edge has an average longitudinal position relative to a fixed position on the principal surface;
   j) the monitor-exposing step is performed such that etchable material is removed from the upper surface of the indicator layer, resulting in a progressive change in the average longitudinal position of the apical edge; and
   k) the step of determining the etching rate is carried out by locating the average longitudinal position of the apical edge at a predetermined time after the monitor-exposing step is commenced.

2. The method of claim 1, wherein:
   a) the monitor body further comprises a grid pattern intermediate the principal surface and the indicator layer;
   b) the grid pattern comprises relatively etch-resistant grid material distinct from the substrate material;
   c) during the monitor-exposing step, progressive portions of the grid pattern are exposed by removal of overlying indicator-layer material; and
   d) the step of determining the etching rate is carried out by locating the apical edge relative to the grid pattern.

3. The method of claim 1, wherein the substrate comprises ceramic material, and the indicator layer comprises a metallic material.

4. The method of claim 2, wherein the substrate comprises ceramic material, the indicator layer comprises a first metallic material, and the grid pattern comprises a second metallic material.

5. The method of claim 1, wherein the etchant environment comprises a liquid etchant solution.

6. The method of claim 5, wherein the liquid etchant solution is provided as a bath.

7. The method of claim 5, wherein the liquid etchant solution is provided as a spray.

8. The method of claim 1, wherein the indicator layer comprises electrochemically deposited metal.

* * * * *